United States Patent
Kang et al.

(10) Patent No.: US 10,171,048 B2
(45) Date of Patent: Jan. 1, 2019

(54) POWER AMPLIFIER

(71) Applicants: Samsung Electro-Mechanics Co., Ltd., Suwon-si (KR); Korea Advanced Institute of Science and Technology, Daejeon (KR)

(72) Inventors: Seung Hoon Kang, Daejeon (KR); Gyu Suck Kim, Suwon-si (KR); Song Cheol Hong, Daejeon (KR)

(73) Assignees: Samsung Electro-Mechanics Co., Ltd., Suwon-si (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 14/993,505

(22) Filed: Jan. 12, 2016

(65) Prior Publication Data

US 2016/0276981 A1  Sep. 22, 2016

(30) Foreign Application Priority Data

Mar. 18, 2015  (KR) ........................ 10-2015-0037319

(51) Int. Cl.
*H03F 1/34* (2006.01)
*H03F 3/21* (2006.01)
*H03F 3/193* (2006.01)
*H03F 1/02* (2006.01)
(Continued)

(52) U.S. Cl.
CPC ............. *H03F 3/21* (2013.01); *H03F 1/0266* (2013.01); *H03F 1/223* (2013.01); *H03F 1/342* (2013.01); *H03F 3/193* (2013.01); *H03F 3/45188* (2013.01); *H03F 2200/129* (2013.01); *H03F 2200/18* (2013.01); *H03F 2200/451* (2013.01); *H03F 2203/45731* (2013.01)

(58) Field of Classification Search
CPC ........................................................ H03F 1/34
USPC ..................................................... 330/291, 85
See application file for complete search history.

(56) References Cited

U.S. PATENT DOCUMENTS

| 4,081,759 A | * | 3/1978 | Yen ........................... H03F 1/34 |
| | | | 330/149 |
| 7,489,200 B2 | * | 2/2009 | Chang ..................... H03F 1/223 |
| | | | 330/278 |

(Continued)

FOREIGN PATENT DOCUMENTS

KR  10-2005-0017617 A  2/2005

OTHER PUBLICATIONS

Kim, Tae Wook, et al. "Highly Linear Receiver Front-End Adopting MOSFET Transconductance Linearization by Multiple Gated Transistors." *Solid-State Circuits, IEEE Journal of* 39.1 ( Jan. 2004): 223-229, Ann Arbor, MI, USA.

(Continued)

*Primary Examiner* — Henry Choe
(74) *Attorney, Agent, or Firm* — NSIP Law

(57) ABSTRACT

A power amplifier according to examples includes an amplifying circuit configured to amplify an input signal, a feedback circuit configured to feedback the amplified signal to the amplifying unit, and a feedback controlling circuit configured to control a power of the fed-back signal based on a power of the input signal. The feedback controlling unit performs controlling so that the power of the fed-back signal is increased as the power of the input signal is increased.

8 Claims, 5 Drawing Sheets

(51) Int. Cl.
*H03F 1/22* (2006.01)
*H03F 3/45* (2006.01)

(56) References Cited

U.S. PATENT DOCUMENTS

| | | | | |
|---|---|---|---|---|
| 7,619,482 | B1* | 11/2009 | Kobayashi | H03F 3/193 |
| | | | | 330/310 |
| 8,686,796 | B2* | 4/2014 | Presti | H03F 1/223 |
| | | | | 330/302 |
| 8,738,066 | B2 | 5/2014 | Akhi et al. | |
| 8,970,308 | B2* | 3/2015 | Wilson | H03H 7/38 |
| | | | | 330/253 |
| 9,319,027 | B1* | 4/2016 | Rafi | H03H 11/0466 |
| 2005/0024148 | A1 | 2/2005 | Kim et al. | |
| 2014/0097893 | A1* | 4/2014 | Ajima | H03F 3/245 |
| | | | | 330/136 |
| 2014/0184335 | A1* | 7/2014 | Nobbe | H03F 1/0227 |
| | | | | 330/291 |

OTHER PUBLICATIONS

Eager, Christian, et al. "A comprehensive analysis of IMD behavior in RF CMOS power amplifiers." *Solid-State Circuits, IEEE Journal of* 39.1 (Jan. 2004): 24-34, Ann Arbor, MI, USA.

\* cited by examiner

POWER AMPLIFIER

CROSS-REFERENCE TO RELATED APPLICATION(S)

This application claims the benefit under 35 USC 119(a) of Korean Patent Application No. 10-2015-0037319 filed on Mar. 18, 2015 in the Korean Intellectual Property Office, the entire disclosure of which is incorporated herein by reference for all purposes.

BACKGROUND

1. Field

The following description relates to a power amplifier.

2. Description of Related Art

In accordance with a rapid increase in demand for a high data rate in a wireless transmitting and receiving system, a multi-carrier scheme or a complicated digital modulation scheme has been adopted to provide this feature. Therefore, a power amplifier included in a transmitting and receiving module that performs wideband code division multiple access (WCDMA) or long term evolution (LTE) communications has been designed to have high linearity.

For example, in an example in which modulation schemes such as quadrature amplitude modulation (QAM) in a higher modulation scheme than a binary phase shift keying (BPSK) modulation scheme are used, linearity of the power amplifier further deteriorates.

However, since there is generally a trade-off between the linearity of the power amplifier and power efficiency of the power amplifier, constructing a power amplifier to have high linearity may have a negative influence on the power efficiency. For example, in order to improve the linearity of the power amplifier, a bias voltage of a gate terminal of a field effect transistor (FET) included in the power amplifier may be adjusted, which may have a large influence on the power efficiency of the power amplifier. In addition, a control of the linearity by the bias voltage of the gate terminal is sensitive to a change in process-voltage-temperature (PVT) issues.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An aspect of the present examples provides a power amplifier.

In one general aspect, a power amplifier includes an amplifying circuit configured to amplify an input signal, a feedback circuit connected to the amplifying circuit, configured to feedback the signal amplified in the amplifying circuit into the amplifying circuit, and a feedback controlling circuit connected to the feedback circuit, configured to control a power of the signal fed-back by the feedback circuit based on a power of the input signal, wherein the feedback controlling circuit performs controlling such that the power of the signal fed-back by the feedback circuit is increased in response to the power of the input signal input to the amplifying circuit being increased.

The amplifying circuit may include a first field effect transistor configured to amplify the input signal input through a gate terminal of the first field effect transistor and to output the amplified signal through a drain terminal of the first field effect transistor, and a second field effect transistor connected to the first field effect transistor in a cascode structure, configured to receive the signal amplified by the first field effect transistor through a source terminal of the second field effect transistor and to output the received signal through a drain terminal of the second field effect transistor.

The feedback circuit may include a feedback field effect transistor configured to pass the fed-back signal between a source terminal and a drain terminal of the feedback field effect transistor and to determine a power of the fed-back signal based on a voltage of a gate terminal of the feedback field effect transistor, and connected to the drain terminal of the second field effect transistor and the gate terminal of the first field effect transistor to feedback a signal amplified in the second field effect transistor into the first field effect transistor.

The feedback controlling circuit may be connected to the gate terminal of the first field effect transistor to sense the power of the input signal, and may provide a feedback voltage to the feedback circuit to control the power of the signal fed-back by the feedback circuit.

The feedback controlling circuit may include a third field effect transistor configured to receive the input signal through a gate terminal of the third field effect transistor, a fourth field effect transistor having a gate terminal connected to a drain terminal of the third field effect transistor, a first capacitor connected to the drain terminal of the third field effect transistor and a source terminal of the fourth field effect transistor, and a second capacitor connected to a source terminal of the third field effect transistor and the gate terminal of the fourth field effect transistor.

The amplifying circuit, the feedback circuit, and the feedback controlling circuit may be formed using a complementary metal oxide semiconductor (CMOS) process.

The power amplifier may further include a first balun connected to the amplifying circuit, configured to convert the input signal from a single signal into differential signals, and a second balun connected to the amplifying circuit, configured to convert the differential signals amplified by the amplifying circuit into a single signal.

The power amplifier may further include a first matching network connected to the amplifying circuit such that an input impedance of the amplifying circuit becomes a preset value, and a second matching network connected to the amplifying circuit such that an output impedance of the amplifying circuit becomes a preset value.

In another general aspect, a power amplifier includes an amplifying circuit configured to amplify an input signal, a semiconductor switch connected to the amplifying circuit, configured to feedback the signal amplified in the amplifying circuit into the amplifying circuit and to switch a power of the fed-back signal, and a voltage providing circuit connected to the semiconductor switch, configured to provide a first voltage to the semiconductor switch in response to the voltage providing circuit being operated in a first mode and to provide a second voltage greater than the first voltage to the semiconductor switch in response to the voltage providing circuit being operated in a second mode, wherein a power of an input signal input to the amplifying circuit during a time period in which the voltage providing circuit is operated in the first mode is lower than a power of an input signal input to the amplifying circuit during a time period in which the voltage providing circuit is operated in the second mode.

The amplifying circuit may include a first field effect transistor configured to amplify an input signal input through a gate terminal of the first field effect transistor and to output the amplified signal through a drain terminal of the first field effect transistor, and a second field effect transistor connected to the first field effect transistor in a cascode structure, configured to receive the signal amplified by the first field effect transistor through a source terminal of the second field effect transistor and to output the received signal through a drain terminal of the second field effect transistor, wherein the semiconductor switch is connected to the drain terminal of the second field effect transistor and the gate terminal of the first field effect transistor to feedback a signal amplified in the second field effect transistor into the first field effect transistor, and has a gate terminal connected to the voltage providing circuit, configured to receive the first voltage or the second voltage.

The voltage providing circuit may sense the power of the input signal input into the amplifying circuit, and an operation mode of the voltage providing circuit may be determined based on a power of the sensed power.

In another general aspect, a power amplifier includes an amplifying circuit configured to amplify an input signal, a variable resistance circuit configured to feedback the amplified signal into the amplifying circuit and having a variable resistance value, and a resistance controlling circuit configured to control a variation in the resistance value of the variable resistance circuit based on a power of the input signal.

The resistance controlling circuit may perform controlling such that the resistance value of the variable resistance unit is reduced as the power of the input signal is increased.

The variable resistance circuit may include a first capacitor and a second capacitor, resistors having different resistance values, and switches each connected to one of the resistors, wherein the switches are switch on or are switched off to conduct or block signals to thereby control the variation in the resistance value of the variable resistance circuit, based on a power of the input signal.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
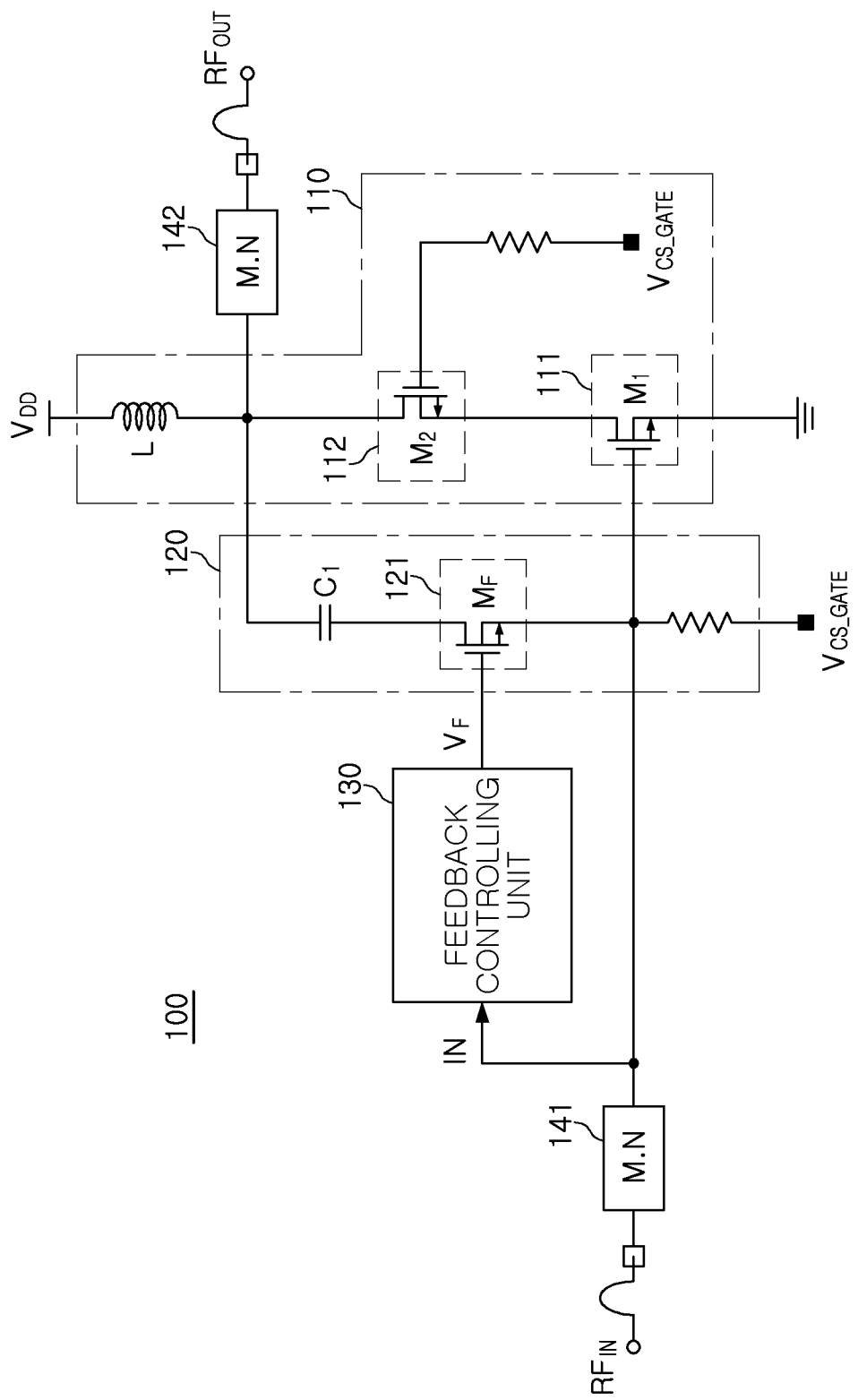
FIG. 1 is a view illustrating a power amplifier including a feedback controlling unit according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, examples are described further with reference to the accompanying drawings. The disclosure may, however, be embodied in many different forms and is not to be construed as being limited to the examples set forth herein. Rather, these examples are provided so that this disclosure is thorough and complete, and fully conveys the scope of the disclosure to those skilled in the art. In the drawings, the shapes and dimensions of elements may be exaggerated for clarity, and the same reference numerals are used throughout to designate the same or like elements.

FIG. 1 is a view illustrating a power amplifier including a feedback controlling unit according to an example.

Referring to the example of FIG. 1, a power amplifier 100 according to an example includes an amplifying unit 110, a feedback unit 120, and a feedback controlling unit 130.

For example, the amplifying unit 110 includes a field effect transistor (FET) that amplifies an input signal input through its source terminal or its gate terminal and outputs the amplified signal through its drain terminal thereof. For example, the amplifying unit 110 is designed to use a linear amplifying scheme that has linearity higher than that of a non-linear amplifying scheme and power efficiency that is lower than that of the non-linear amplifying scheme.

For example, the amplifying unit 110 includes a first field effect transistor 111 that amplifies an input signal input through its gate terminal and outputs the amplified signal through its drain terminal. The amplifying unit 110 also includes a second field effect transistor 112 connected to the first field effect transistor 111 in a cascode structure, so as to receive the signal amplified by the first field effect transistor 111 through its source terminal and to output the received signal through its drain terminal. In this example, the first field effect transistor 111 is operated in a common source (CS) amplifying stage, and the second field effect transistor 112 is operated in a common gate (CG) amplifying stage.

Therefore, in a case in which breakdown voltages of the first and second field effect transistors 111 and 112 are low, the amplifying unit 110 stably amplifies the input signal.

The feedback unit 120 is connected to the amplifying unit 110 in order to feedback the signal amplified in the amplifying unit 110 into the amplifying unit 110. Therefore, stability, bandwidth, and linearity of the power amplifier 100 are improved by using this approach.

For example, the feedback unit 120 includes a feedback field effect transistor 121 passing the fed-back signal between its source terminal and its drain terminal and for determining a power of the fed-back signal, depending on a voltage of its gate terminal.

For example, the feedback unit 120 is connected to the drain terminal of the second field effect transistor 112 and the gate terminal of the first field effect transistor 111, so as to feedback a signal amplified in the second field effect transistor 112 into the first field effect transistor 111.

The feedback controlling unit 130 is connected to the feedback unit 120 so as to control a power of the signal fed-back by the feedback unit 120 based on a power of the input signal. In further detail, the feedback controlling unit 130 performs controlling so that the power of the signal fed-back by the feedback unit 120 is increased as the power of the input signal input to the amplifying unit 110 is increased. Therefore, linearity of the power amplifier 100 is improved in a case in which the power amplifier 100 amplifies a small signal of which power is low, as compared with in a case in which the power amplifier 100 amplifies a large signal of which power is high.

For example, the feedback controlling unit 130 is connected to the gate terminal of the first field effect transistor 111 to sense the power of the input signal and to provide a feedback voltage to the feedback unit 120 to control the power of the signal fed-back by the feedback unit 120.

Meanwhile, the amplifying unit 110, the feedback unit 120, and the feedback controlling unit 130 are implemented by a complementary metal oxide semiconductor (CMOS) process. For example, the entire power amplifier 100 is implemented by the CMOS process.

Most general transmitting and receiving modules are implemented by using a CMOS process and have been integrated into a single chip. However, the power amplifier is potentially implemented using a compound semiconductor process such as Indium Gallium Phosphide (InGaP)/Gallium Arsenide (GaAs) heterojunction bipolar transistor (HBT) or Gallium Nitride (GaN) processes. For example, an HBT is a type of bipolar junction transistor (BJT) that uses differing semiconductor materials for the emitter and base regions, creating a heterojunction. An HBT offers the feature that it can handle signals of very high frequencies, up to several hundred GHz.

In an example in which a chip implemented by the CMOS process and a chip implemented by the compound semiconductor process are integrated in one package in a multi-chip structure, a size of a chip is increased, and thus a cost of the chip is increased, and it is potentially difficult to couple the chip to a CMOS bias circuit for improving linearity of the power amplifier. Therefore, in such an example, the amplifying unit 110, the feedback unit 120, and the feedback controlling unit 130 are implemented by the CMOS process, whereby the entire transmitting and receiving module are integrated in one package in a single chip structure. Therefore, a size of a chip is decreased, and thus a cost of the chip is decreased.

The power amplifier implemented by the CMOS process has a breakdown voltage that is lower than that of the power amplifier implemented by the compound semiconductor process. Therefore, the amplifying unit 110 has a cascode structure in which two transistors 111 and 112 are stacked.

Meanwhile, the power amplifier 100 further includes a first matching network 141 connected to the amplifying unit 110 so that an input impedance of the amplifying unit 110 becomes a preset value. The power amplifier also includes a second matching network 142 connected to the amplifying unit 110 so that an output impedance of the amplifying unit 110 becomes a preset value. For instance, the power amplifier 100 receives a single signal, amplifies the received signal, and outputs the amplified signal as a single signal.

Figure 2:
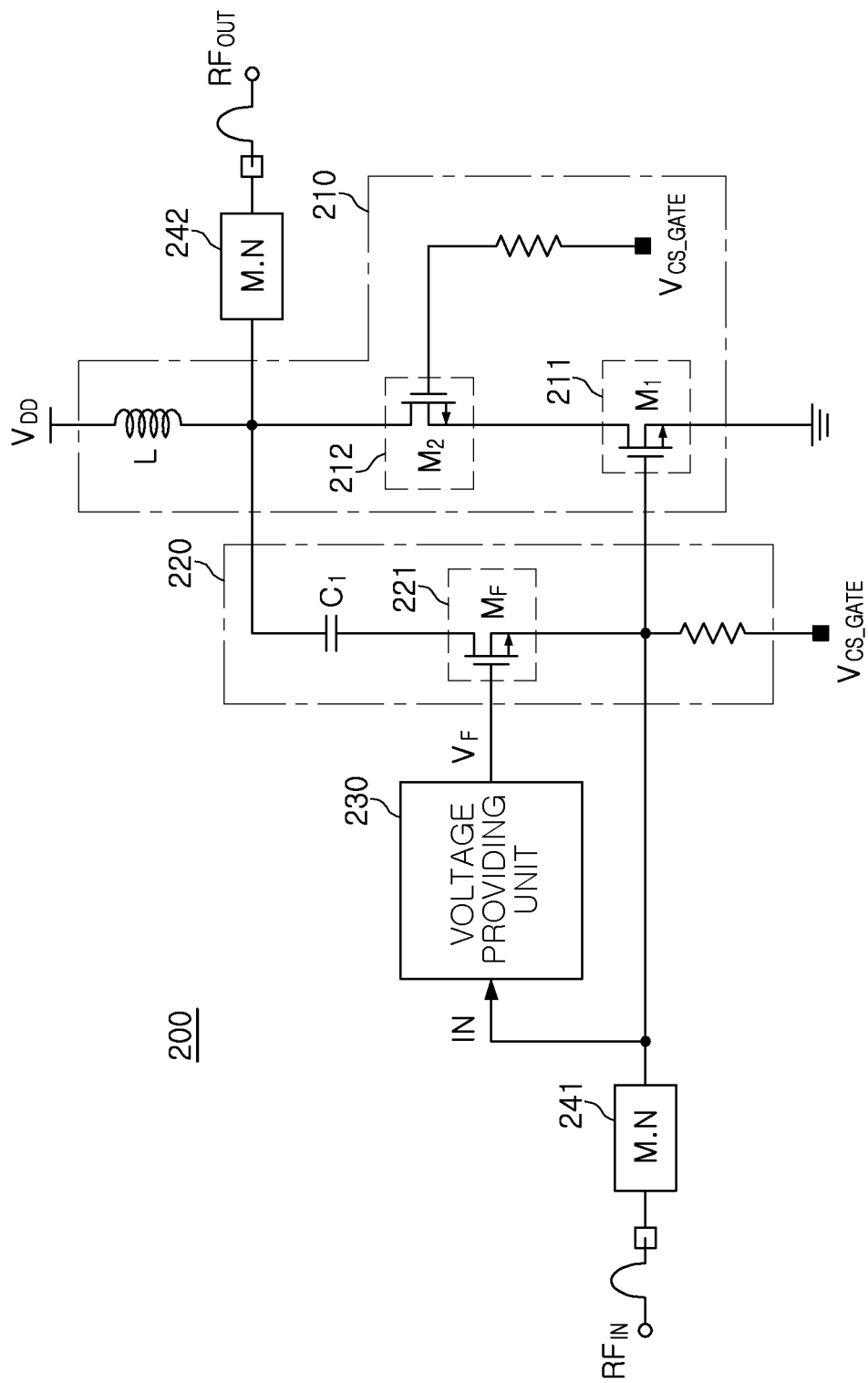
FIG. 2 is a view illustrating a power amplifier including a voltage providing unit according to another example.

FIG. 2 is a view illustrating a power amplifier including a voltage providing unit according to another example.

Referring to the example of FIG. 2, a power amplifier 200 according to another example includes an amplifying unit 210, a semiconductor switch 220, and a voltage providing unit 230.

The amplifying unit 210 includes an FET that amplifies an input signal that is input through its source terminal or its gate terminal and outputs the amplified signal through its drain terminal.

In such an example, the amplifying unit 210 includes a first field effect transistor 211 that amplifies an input signal input through its gate terminal and outputs the amplified signal through its drain terminal. The amplifying unit 210 also includes a second field effect transistor 212 connected to the first field effect transistor 211 in a cascode structure so as to receive the signal amplified by the first field effect transistor 211 through its source terminal and to output the received signal through its drain terminal.

In this example, the semiconductor switch 220 is connected to the amplifying unit 210 in order to feedback the signal amplified in the amplifying unit 210 to the amplifying unit 210 and to switch a power of the fed-back signal.

For example, the semiconductor switch 220 is connected to the drain terminal of the second field effect transistor 212 and the gate terminal of the first field effect transistor 211, so as to feedback a signal amplified in the second field effect transistor 212 into the first field effect transistor 211, and has a gate terminal connected to the voltage providing unit 230 so as to receive a first voltage or a second voltage.

Also, the voltage providing unit 230 is connected to the semiconductor switch 220 in order to provide the first voltage to the semiconductor switch 220 when the voltage providing unit 230 is operated in a first mode and in order to provide the second voltage that is higher than the first voltage to the semiconductor switch 220 when the voltage providing unit 230 is operated in a second mode. In an example, the first mode is an amplification mode of a low power signal, and the second mode is an amplification mode of a high power signal.

In further detail, in this example, a power of an input signal input into the amplifying unit 210 when the voltage providing unit 230 is operated in the first mode is lower than that of an input signal input into the amplifying unit 210 when the voltage providing unit 230 is operated in the second mode. Therefore, linearity of the power amplifier 200 is improved in the first mode in which the power amplifier 200 amplifies a small signal of which power is low as compared to the second mode in which the power amplifier 200 amplifies a large signal, of which power is high.

For example, the voltage providing unit 230 senses a power of the input signal input into the amplifying unit 210, and an operational mode of the voltage providing unit 230 is determined based on a power of the sensed power. However, the power of the input signal is not limited to being sensed in only the voltage providing unit 230, and is also potentially sensed outside the power amplifier 200, depending on a design. In further detail, operation of the voltage providing unit 230 is similar to detailed operation of a feedback controlling unit to be described further below with reference to the example of FIG. 5.

Meanwhile, a difference between the first and second voltages is potentially 0.3V or more and is potentially equal to or less than a level of a power supply $V_{DD}$ voltage. When the difference between the first and second voltages is large, the voltage providing unit 230 is potentially insensitive to a change in process-voltage-temperature (PVT), and thus the voltage providing unit 230 is stably operated in the first mode or the second mode. Therefore, the voltage providing unit 230 is insensitive to the change in the PVT to stably improve linearity.

Figure 3:
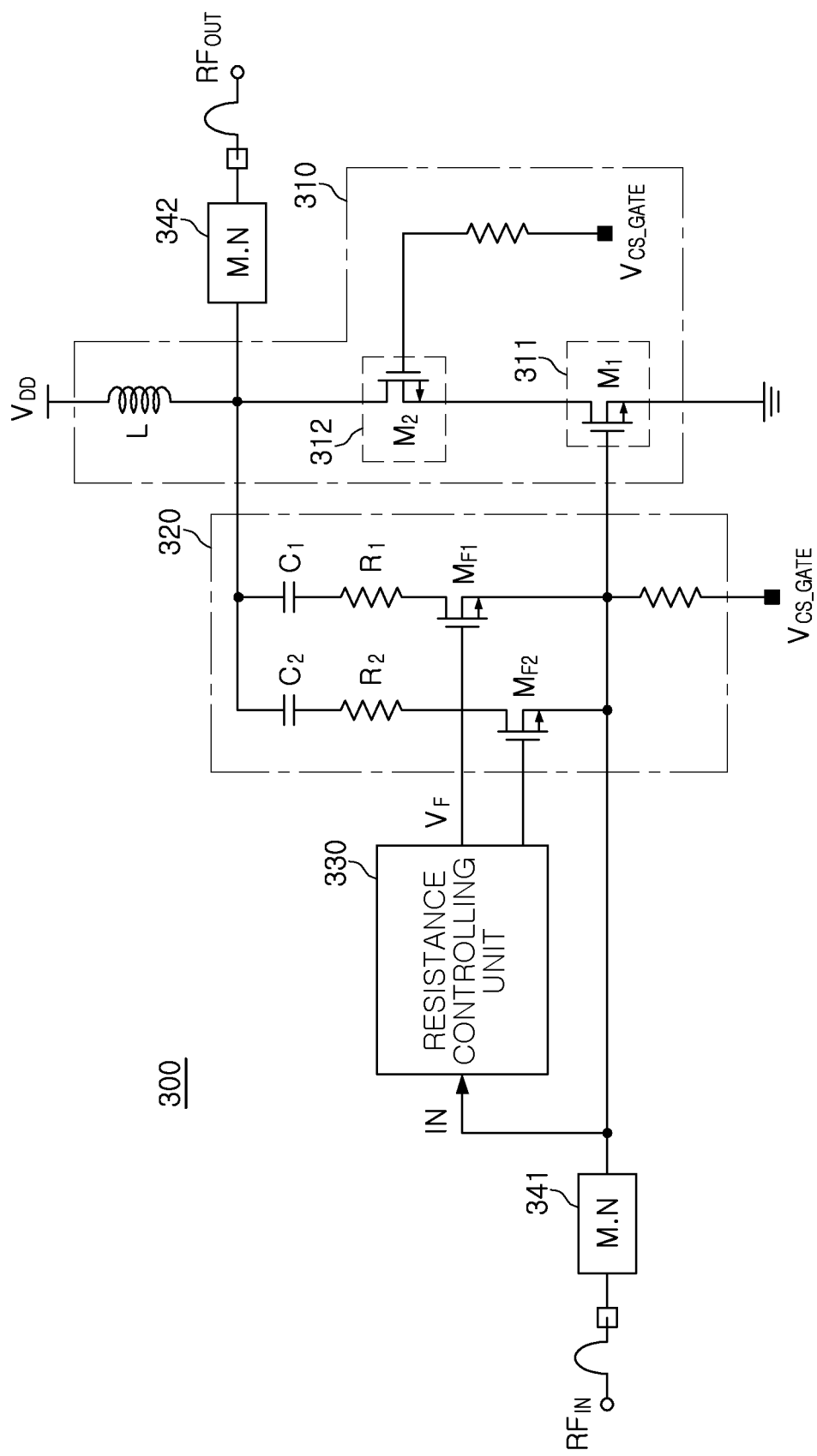
FIG. 3 is a view illustrating a power amplifier including a resistance controlling unit according to another example.

FIG. 3 is a view illustrating a power amplifier including a resistance controlling unit according to another example.

Referring to FIG. 3, a power amplifier 300 according to another example includes an amplifying unit 310, a variable resistance unit 320, and a resistance controlling unit 330.

For example, the amplifying unit 310 includes an FET that amplifies an input signal input through its source terminal or its gate terminal and outputs the amplified signal through its drain terminal.

For example, the amplifying unit 310 includes a first field effect transistor 311 that amplifies an input signal input through its gate terminal and outputting the amplified signal through its drain terminal and a second field effect transistor 312 connected to the first field effect transistor 311 in a cascode structure to receive the signal amplified by the first field effect transistor 311 through its source terminal and output the received signal through its drain terminal.

The variable resistance unit 320 is connected to the amplifying unit 310 so as to feedback the signal amplified in the amplifying unit 310 into the amplifying unit 310, and to have a variable resistance value.

For example, the variable resistance unit 320 is connected to the drain terminal of the second field effect transistor 312 and the gate terminal of the first field effect transistor 311 so as to feedback a signal that is amplified in the second field effect transistor 312 into the first field effect transistor 311.

For example, the variable resistance unit 320 includes capacitors $C_1$ and $C_2$, a plurality of resistors $R_1$ and $R_2$ having different resistance values, and a plurality of switches $M_{F1}$ and $M_{F2}$ each connected to the plurality of resistors $R_1$ and $R_2$. In such an example, the switches of the plurality of switches are switched on or are switched off to conduct or block signals, accordingly. In an example in which one of the plurality of switches is in a switched-on state, a total resistance value of the variable resistance unit 320 is found to be the sum of a resistance value of the switch that is in the switched-on state and a resistance value of a resistor connected to the switch that is in the switched-on state in series.

Thus, in this example, the resistance controlling unit 330 is connected to the variable resistance unit 320 to control a variation in the resistance value of the variable resistance unit 320, based on a power of the input signal.

In further detail, the resistance controlling unit 330 performs controlling so that the resistance value of the variable resistance unit 320 is reduced accordingly as the power of the input signal input to the amplifying unit 310 is increased. Therefore, linearity of the power amplifier 300 is improved in an example in which the power amplifier 300 amplifies a small signal of which power is low, as compared with an example in which the power amplifier 300 amplifies a large signal, of which power is high. A detailed operation of the resistance controlling unit 330 is similar to a detailed operation of a feedback controlling unit to be described further below with reference to FIG. 5.

For example, the resistance controlling unit 330 controls switch-on/off operation of the plurality of switches $M_{F1}$ and $M_{F2}$ so as to control for a variation in the resistance value of the variable resistance unit 320.

Figure 4:
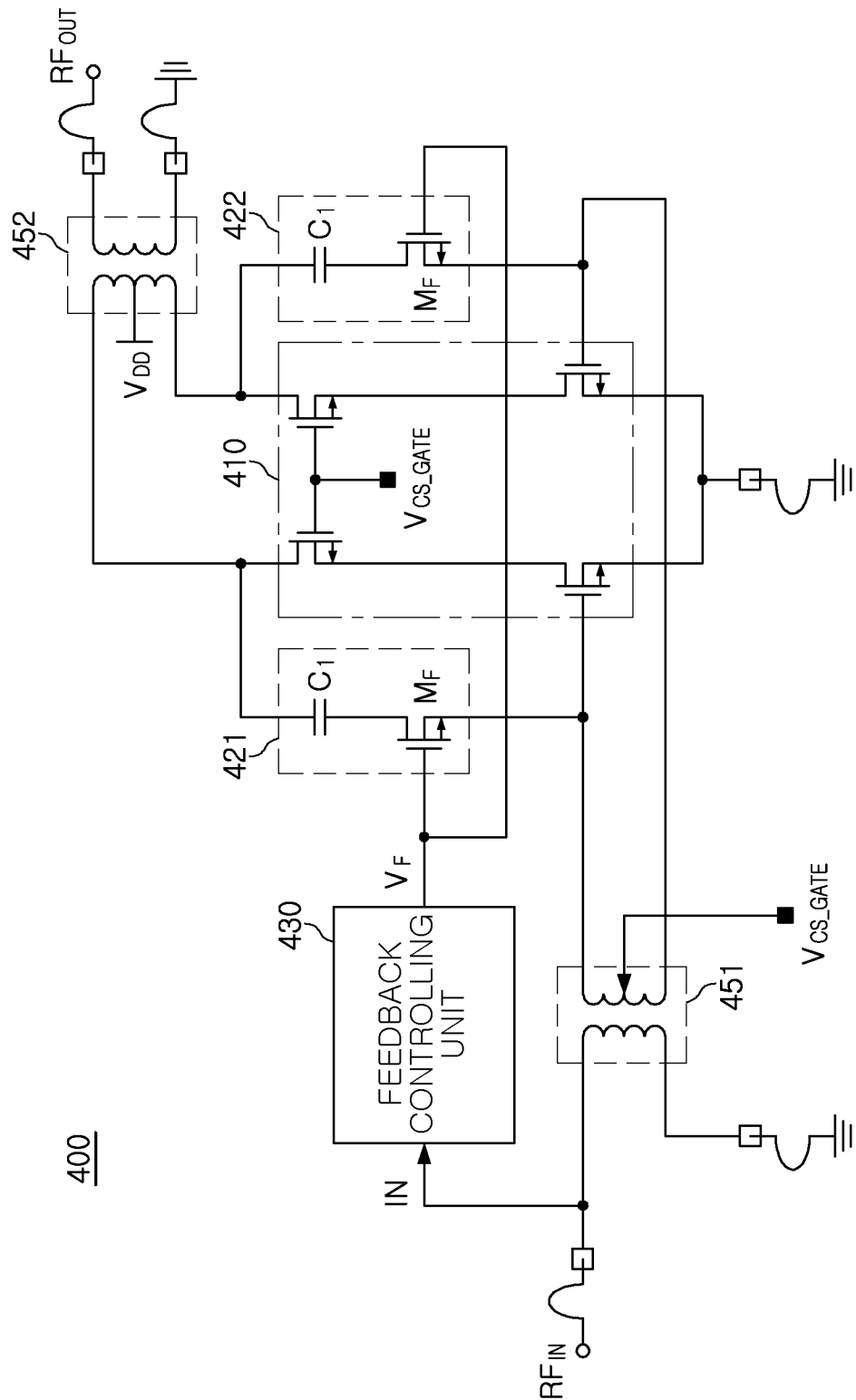
FIG. 4 is a view illustrating a power amplifier amplifying differential signals according to another example.

FIG. 4 is a view illustrating a power amplifier amplifying differential signals according to another example.

Referring to the example of FIG. 4, a power amplifier 400 according to another example includes an amplifying unit 410, feedback units 421 and 422, and a feedback controlling unit 430 to amplify differential signals.

For example, the power amplifier 400 further includes a first balanced to unbalanced transformer, hereinafter, referred to as a balun, 451 connected to the amplifying unit 410 so as to convert an input signal from a single signal into differential signals and a second balun 452 connected to the amplifying unit 410 so as to convert the differential signals amplified by the amplifying unit 410 into a single signal.

Figure 5:
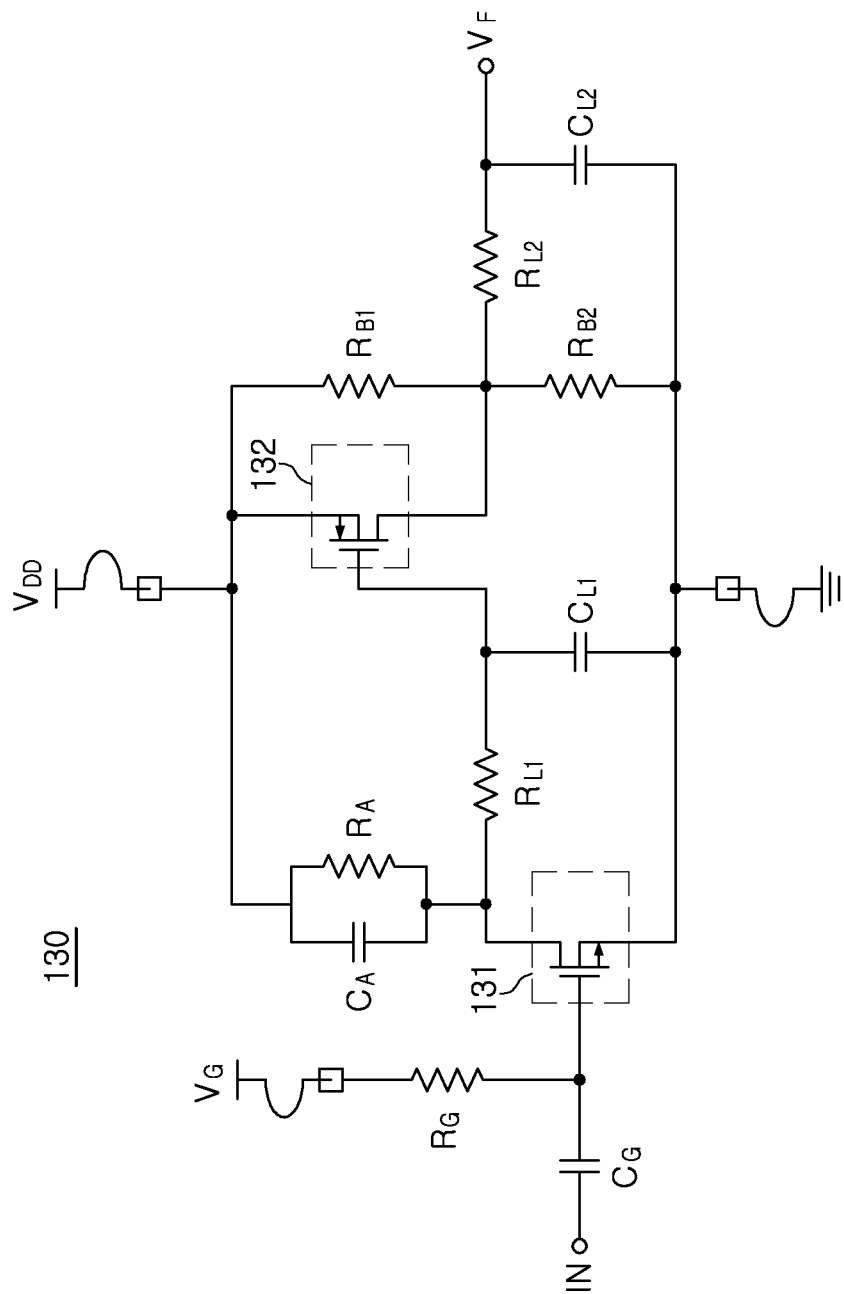
FIG. 5 is a view illustrating the feedback controlling unit illustrated in the example of FIG. 1.

FIG. 5 is a view illustrating the feedback controlling unit illustrated in the example of FIG. 1.

Referring to the example of FIG. 5, the feedback controlling unit 130 includes a third field effect transistor 131, a fourth field effect transistor 132, a first capacitor $C_A$, and a second capacitor $C_{L1}$.

The third field effect transistor 131 receives the input signal at its gate terminal.

In this example, the fourth field effect transistor 132 has a gate terminal connected to a drain terminal of the third field effect transistor 131.

The first capacitor $C_A$ is connected to the drain terminal of the third field effect transistor 131 and a source terminal of the fourth field effect transistor 132.

The second capacitor $C_{L1}$ is connected to a source terminal of the third field effect transistor 131 and the gate terminal of the fourth field effect transistor 132.

Hereinafter, further details about the operation of the feedback controlling unit 130 are described.

For example, the feedback controlling unit 130 senses an input signal $V_G$ through the third field effect transistor 131, amplifies the input signal through the fourth field effect transistor 132, ands converts the input signal into a direct current (DC) voltage through the first capacitor $C_A$ and the second capacitor $C_{L1}$.

Here, in an example, the input signal input into the feedback controlling unit 130 is inverted twice when passing through the third field effect transistor 131 and the fourth field effect transistor 132. Therefore, as power of the input signal input to the feedback controlling unit 130 is increased, an output voltage $V_F$ accordingly increases.

Here, the first capacitor $C_A$ and the second capacitor $C_{L1}$ convert the input signal into the DC voltage through RC low pass filtering. In the RC low pass filtering, the larger the resistance value and the capacitance, the lower the cut-off frequency.

For example, the feedback controlling unit 130 consumes a DC current of 0.8 mA. Since such a DC current of 0.8 mA is negligible as compared with a current ranging in several tens to several hundreds of mA that is usually consumed in a power amplifier, the DC current consumed by the feedback controlling unit 130 potentially does not have a substantial influence on power efficiency of the power amplifier.

In addition, in such an example, a size of the feedback controlling unit 130 is small, and thus the presence of the feedback controlling unit 130 may not substantially have an influence on a size of the power amplifier.

Subsequently, a linearity improvement principle of the power amplifier according to an example is described. In this discussion, it is to be assumed that a point at which a $3^{rd}$ order transconductance (gm3) is minimized in an amplifying stage is referred to as a sweet-spot.

Since IMD3, which is a standard of linearity, is closely related to a non-linear index gm3, as discussed above, in a case in which a gate voltage that obtains the sweet-spot is applied to the amplifying unit, the IMD3 is decreased by approximately 20 dB at most.

As a class of the power amplifier progresses in a sequence of class C→class AB→class A, the IMD3 sweet-spot moves toward a low power. Hence, in an example in which the power amplifier is operated at class C, a gain expansion phenomenon is present, and in an example in which the power amplifier is moved toward an operation of class A, a gain compression phenomenon potentially occurs.

Similarly, in the power amplifier according to an example, the gain expansion phenomenon and the gain compression phenomenon occur depending on a power of the signal that is fed-back to the amplifying unit. Therefore, in an example in which the input power is high, the power of the signal fed-back to the amplifying unit is increased, and thus the field effect transistor included in the amplifying unit is operated in the vicinity of a point at which the $3^{rd}$ order transconductance (gm3) is minimized, and as a result, the linearity of the power amplifier is improved.

Subsequently, an example of the performance of the power amplifier is described further.

The power of the signal that is fed-back to the amplifying unit is changed by adjusting the feedback voltage $V_F$ of the feedback unit serving as a resistor. In an example in which the feedback voltage of the feedback unit is increased, an equivalent resistance of the feedback unit is decreased, and thus the power of the signal fed-back to the amplifying unit is increased. Likewise, in an example in which the feedback voltage of the feedback unit is decreased, an equivalent resistance of the feedback unit accordingly increases, and thus the power of the signal fed-back to the amplifying unit accordingly decreases.

For instance, as the feedback voltage of the feedback unit is increased, a power gain curve of the amplifying unit moves accordingly from gain compression toward gain expansion.

For example, in an example in which the feedback voltage $V_F$ is 1.3V, a condition under which the largest gain compression is generated, the IMD3 sweet-spot is generated at a low output power point, and linearity is deteriorated toward high output power. Therefore, in such an example, an output power point satisfying a standard of IMD3=−40 dBc is possibly about 12 dBm, which is low.

Conversely, in an example in which the feedback voltage $V_F$ is 1.9V, a condition under which the largest gain expansion is generated, the IMD3 sweet-spot is generated at a high output power point, and linearity deteriorates at low output power.

Therefore, in such an example, the feedback controlling unit controls the feedback voltage $V_F$ to be 1.3V at the low output power point and be 1.9V at the high output power point. As a result the power amplifier satisfying IMD3=−40 dBc from the low output power point to the high output power point is designed.

Therefore, in the power amplifier according to an example, a feedback amount is adjusted to track the IMD3 sweet-spot of each output power value. Therefore, the linearity of the power amplifier is improved without having a large influence on the power efficiency of the power amplifier. Accordingly, the power amplifier is insensitive to a change in PVT, and thus the linearity of the power amplifier is stably improved.

The feedback voltage $V_F$ output from the feedback controlling unit increases as power of an input signal RFIN of the power amplifier is increased. Here, the feedback voltage $V_F$ is a DC voltage based on input power. Therefore, the power amplifier according to an example is operated so that the feedback voltage $V_F$ increases as the input power is increased.

For example, a standard of IMD3=−40 dBc is potentially satisfied from a low output power point to a high output power point, and a maximum linear output power point up to 21 dBm is also secured.

In relation to the −40 dBc of IMD3, an alternative power amplifier that is not controlled by the feedback controlling unit only maintains high linearity up to an output power of about 13 dBm. By contrast, the power amplifier according to an example maintains high linearity up to an output power of about 21 dBm.

As set forth above, according to an example, the linearity of the power amplifier is improved without having a large influence on the power efficiency of the power amplifier. Also, the power amplifier is insensitive to the change in PVT, and thus the linearity of the power amplifier is stably improved.

In addition, according to an example, the linearity of the power amplifier is improved in a case in which the power amplifier amplifies a small signal of which power is relatively low as compared with in a case in which the power amplifier amplifies a large signal of which power is high.

The apparatuses, units, modules, devices, and other components illustrated in FIGS. 1-5 that perform the operations described herein with respect to FIGS. 1-5 are implemented by hardware components. Examples of hardware components include controllers, sensors, generators, drivers, memories, comparators, arithmetic logic units, adders, subtractors, multipliers, dividers, integrators, and any other electronic components known to one of ordinary skill in the art. In one example, the hardware components are implemented by computing hardware, for example, by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1-5. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-5 that perform the operations described herein with respect to FIGS. 1-5 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplifier comprising:
   an amplifying circuit comprising
   a first field effect transistor configured to amplify an input signal, and
   a second field effect transistor connected to the first field effect transistor in a cascode structure, and configured to receive the signal amplified by the first field effect transistor and to output the received signal;
   a feedback circuit connected to the amplifying circuit, and configured to feedback the signal amplified in the amplifying circuit into the amplifying circuit; and
   a feedback controlling circuit connected to the feedback circuit, and configured to control a power of the signal fed-back by the feedback circuit based on a power of the input signal,
   wherein the feedback controlling circuit is configured to control the feedback circuit to increase the power of the signal fed-back by the feedback circuit, in response to the power of the input signal input to the amplifying circuit being increased.

2. The power amplifier of claim 1, wherein
   the first field effect transistor is configured to amplify the input signal input through a gate terminal of the first field effect transistor and to output the amplified signal through a drain terminal of the first field effect transistor, and
   the second field effect transistor is configured to receive the signal amplified by the first field effect transistor through a source terminal of the second field effect transistor and to output the received signal through a drain terminal of the second field effect transistor.

3. The power amplifier of claim 2, wherein the feedback circuit comprises a feedback field effect transistor configured to pass the fed-back signal between a source terminal and a drain terminal of the feedback field effect transistor and to determine a power of the fed-back signal based on a voltage of a gate terminal of the feedback field effect transistor, and connected to the drain terminal of the second field effect transistor and the gate terminal of the first field effect transistor to feedback a signal amplified in the second field effect transistor into the first field effect transistor.

4. The power amplifier of claim 2, wherein the feedback controlling circuit is connected to the gate terminal of the first field effect transistor to sense the power of the input signal, and provides a feedback voltage to the feedback circuit to control the power of the signal fed-back by the feedback circuit.

5. The power amplifier of claim 1, wherein the feedback controlling circuit comprises:
   a third field effect transistor configured to receive the input signal through a gate terminal of the third field effect transistor;
   a fourth field effect transistor having a gate terminal connected to a drain terminal of the third field effect transistor;
   a first capacitor connected to the drain terminal of the third field effect transistor and a source terminal of the fourth field effect transistor; and
   a second capacitor connected to a source terminal of the third field effect transistor and the gate terminal of the fourth field effect transistor.

6. The power amplifier of claim 1, wherein the amplifying circuit, the feedback circuit, and the feedback controlling circuit are formed using a complementary metal oxide semiconductor (CMOS) process.

7. The power amplifier of claim 1, further comprising:
a first balun connected to the amplifying circuit, configured to convert the input signal from a single signal into differential signals; and
a second balun connected to the amplifying circuit, configured to convert the differential signals amplified by the amplifying circuit into a single signal.

8. The power amplifier of claim 1, further comprising:
a first matching network connected to the amplifying circuit such that an input impedance of the amplifying circuit becomes a preset value; and
a second matching network connected to the amplifying circuit such that an output impedance of the amplifying circuit becomes a preset value.

\* \* \* \* \*